(12) United States Patent
Ishii et al.

(10) Patent No.: US 8,288,937 B2
(45) Date of Patent: Oct. 16, 2012

(54) WHITE LED, AND BACKLIGHT AND LIQUID CRYSTAL DISPLAY DEVICE USING THE SAME

(75) Inventors: Tsutomu Ishii, Yokohama (JP); Yasumasa Ooya, Chigasaki (JP); Ryo Sakai, Yokohama (JP); Katsutoshi Nakagawa, Yokohama (JP); Hajime Takeuchi, Yokohama (JP); Yumi Ito, Yokohama (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 12/955,999

(22) Filed: Nov. 30, 2010

(65) Prior Publication Data
US 2011/0128466 A1 Jun. 2, 2011

Related U.S. Application Data

(63) Continuation of application No. PCT/JP2009/002318, filed on May 26, 2009.

(30) Foreign Application Priority Data

May 30, 2008 (JP) ................ P2008-143761

(51) Int. Cl.
*H01L 33/00* (2010.01)
*H01J 1/62* (2006.01)
(52) U.S. Cl. ........................ 313/503; 313/506
(58) Field of Classification Search .......... 313/501–503, 313/506; 349/71, 61
See application file for complete search history.

(56) References Cited

U.S. PATENT DOCUMENTS
2004/0135504 A1 7/2004 Tamaki et al.
(Continued)

FOREIGN PATENT DOCUMENTS
JP 2000-031531 1/2000
(Continued)

OTHER PUBLICATIONS
International Search Report issued Jun. 12, 2009 in International Application No. PCT/JP2009/002318 filed May 26, 2009.
(Continued)

*Primary Examiner* — Karabi Guharay
(74) *Attorney, Agent, or Firm* — Oblon, Spivak, McClelland, Maier & Neustadt, L.L.P.

(57) ABSTRACT

A white LED includes a light emitting element with a light emission peak wavelength equal to or longer than 380 nm and equal to or shorter than 420 nm, and a phosphor layer containing three or more types of phosphors including at least a blue phosphor, a green phosphor, and a red phosphor and disposed in a manner to cover at least part of the light emitting element. The phosphor layer has a first phosphor layer and a second phosphor layer disposed in an opposite side of a side of the light emitting element of the first phosphor layer. In the first phosphor layer, a content of the blue phosphor in an entire phosphor contained in the first phosphor layer is equal to or less than 5 mass %, or the blue phosphor is not contained. In the second phosphor layer, a content of phosphor other than the blue phosphor in an entire phosphor contained in the second phosphor layer is equal to or less than 5 mass %, or no phosphor other than the blue phosphor is contained.

9 Claims, 5 Drawing Sheets

U.S. PATENT DOCUMENTS

| | | | |
|---|---|---|---|
| 2004/0217692 | A1 | 11/2004 | Cho et al. |
| 2004/0245532 | A1 | 12/2004 | Maeda |
| 2006/0038477 | A1 | 2/2006 | Tamaki et al. |
| 2008/0089825 | A1 | 4/2008 | Tamaki et al. |
| 2008/0122343 | A1* | 5/2008 | Maruyama et al. ........... 313/503 |
| 2009/0072708 | A1 | 3/2009 | Tamaki et al. |
| 2010/0090585 | A1* | 4/2010 | Seto et al. .................... 313/503 |

FOREIGN PATENT DOCUMENTS

| | | |
|---|---|---|
| JP | 2004-71726 | 3/2004 |
| JP | 2004-179644 | 6/2004 |
| JP | 2004-363564 | 12/2004 |
| JP | 2005-302920 | 10/2005 |
| JP | 2006-261554 | 9/2006 |
| JP | 2006-332269 | 12/2006 |
| JP | 2007-96133 | 4/2007 |
| JP | 3993854 | 8/2007 |

OTHER PUBLICATIONS

Written Opinion for PCT/JP2009/002318 issued Jun. 12, 2009.
International Search Report issued for WO 03/080764 (corresponding to US 2004/0135504 A1, 2006/0038477 A1, 2008/0089825 A1, 2009/0072708 A1) on Jun. 17, 2003.
International Preliminary Report on Patentability and Written Opinion issued Jan. 20, 2011, in International application No. PCT/JP2009/002318, International filing date May 26, 2009 (English translation only).
Korean Office Action (w/English translation), mailed Nov. 21, 2011 for Korean Application No. 2010-7029540.

* cited by examiner

WHITE LED, AND BACKLIGHT AND LIQUID CRYSTAL DISPLAY DEVICE USING THE SAME

CROSS-REFERENCE TO RELATED APPLICATION

This application is continuation of prior International Application No. PCT/JP2009/002318, filed on May 26, 2009 which is based upon and claims the benefit of priority from Japanese Patent Application No. 2008-143761, filed on May 30, 2008; the entire contents of all of which are incorporated herein by reference.

FIELD

Embodiments described herein relate to a white LED, and to a backlight and a liquid crystal display device using the same.

BACKGROUND

In recent years, there is developed a white LED having characteristics such as compactness, a longer operating life, low voltage drive, and being free of mercury, in relation to mercy gas excitation-type fluorescent light tube (FL) and cold cathode fluorescent light tube (CCFL), which have been used for general lighting and backlights for liquid crystal display devices.

With regard to the white LED, there are a type 1 in which white light is emitted by combining light emitting diodes of three colors of a blue-light light emitting diode, a green light emitting diode, and a red light emitting diode, and a type 2 in which white light is emitted by combining a long-wavelength ultraviolet-light (300 to 430 nm) or blue-wavelength light (460 to 480 nm) emitting diode as an excitation source and a phosphor layer containing a phosphor of a single color or a plurality of colors which emits visible light. Since the white LED of the type 2 leads to reduction of the number of light emitting diodes and heat generation of the entire can be suppressed, development of the white LED of the type 2 is vigorously done in recent years.

Among the white LEDs of the type 2, the one using the light emitting diode (hereinafter, referred to as an ultraviolet-light light emitting diode) emitting a long wavelength ultraviolet ray (300 to 430 nm) obtains white light by using phosphors of three colors of blue, green, and red as phosphors.

On the other hand, the one using the light emitting diode (hereinafter, referred to as a blue-light light emitting diode) of the blue wavelength (460 to 480 nm) obtains white light by using phosphors of two colors of green and red or a phosphor of yellow as a phosphor(s).

Among the white LEDs using the blue-light light emitting diode, the one using the phosphors of two colors of green and red has a problem that color unevenness is large and that dispersion of chromaticity is also large. The one using the yellow phosphor has a problem that color reproducibility is narrow, that color rendering is also bad, and that designing to a predetermined chromaticity is difficult. On the other hand, the white LED using the ultraviolet-light light emitting diode, where there is a wide variety of phosphors to be used compared with the one using the blue-light light emitting diode and thus color reproducibility is wide and predetermined chromaticity is easier to be obtained, is suitable for a backlight light source in a liquid crystal display device.

As the phosphor used along with the ultraviolet-light light emitting diode, for example, an europium-activated halophosphate phosphor or an europium-activated aluminate phosphor as a blue phosphor, a copper/aluminum-activated zinc sulfide phosphor or an europium/manganese-activated aluminate phosphor as a green phosphor, and an europium-activated yttrium oxysulfide phosphor or an europium-activated lanthanum oxysulfide phosphor as a red phosphor are combinedly used.

Meanwhile, the white LED using the ultraviolet-light light emitting diode is manufactured, for example, by adding and mixing phosphors of three colors of the blue phosphor, the green phosphor, and the red phosphor to a transparent resin thereby to prepare a phosphor slurry, thereafter applying this phosphor slurry onto the ultraviolet-light light emitting diode, and curing the phosphor slurry. A compounding amount of the phosphor, properly chosen according to aimed chromaticity, is that, for example, among a total amount of the phosphors of the blue phosphor, the green phosphor, and the red phosphor, the blue phosphor occupies equal to or more than 15 mass % and equal to or less than 25 mass %, the green phosphor occupies equal to or more than 15 mass % and equal to or less than 25 mass %, and the red phosphor occupies the rest (for example, see JP-A 2007-096133 (KOKAI)).

In recent years, usage of white LEDs as backlight light sources in a variety of liquid crystal display devices such as small screens of a cellular phone, a car navigation system, a mobile communication device and the like, and medium/large screens of a personal computer and TV and so on has been discussed.

However, with regard to the white LED using the ultraviolet-light light emitting diode, there is a problem that chromaticity gradually changes after light emission due to temperature rise by heat generation by itself. Concretely, values x, y in an XYZ color system of CIE change in a manner to gradually increase in accordance with temperature rise. Further, such change of chromaticity halts light emission of the white LED, and is repeated after light is emitted again.

As stated above, since chromaticity may change upon temperature rise in a white LED using an ultraviolet-light light emitting diode, application thereof to a backlight light source in a liquid crystal display device is not necessarily easy. In particular, since a cellular phone, a car navigation system, a mobile communication device and the like may be left in a sun-heated vehicle and reach quite a high temperature, a white LED as a back light source in that liquid crystal display device is required to have a small chromaticity change due to temperature rise.

DETAILED DESCRIPTION

In one embodiment, a white LED includes a light emitting element with a light emission peak wavelength equal to or longer than 380 nm and equal to or shorter than 420 nm, and a phosphor layer containing three or more types of phosphors including at least a blue phosphor, a green phosphor, and a red phosphor. The phosphor layer has a first phosphor layer and a second phosphor layer disposed in an opposite side of a side of the light emitting element of the first phosphor layer. In the first phosphor layer, a content of the blue phosphor in an entire phosphor contained in the first phosphor layer is equal to or less than 5 mass %, or the blue phosphor is not contained. In the second phosphor layer, a content of the phosphor other than the blue phosphor in an entire phosphor contained in the second phosphor layer is equal to or less than 5 mass %, or no phosphor other than the blue phosphor is contained.

In one embodiment, a backlight includes a plurality of the white LEDs of the embodiment, and a substrate to which the white LEDs are mounted. A liquid crystal display device includes a backlight which includes a plurality of the white LEDs of the embodiment and a substrate to which the white LEDs are mounted, and a liquid crystal panel disposed in a light emitting surface side of the backlight.

Figure 1:
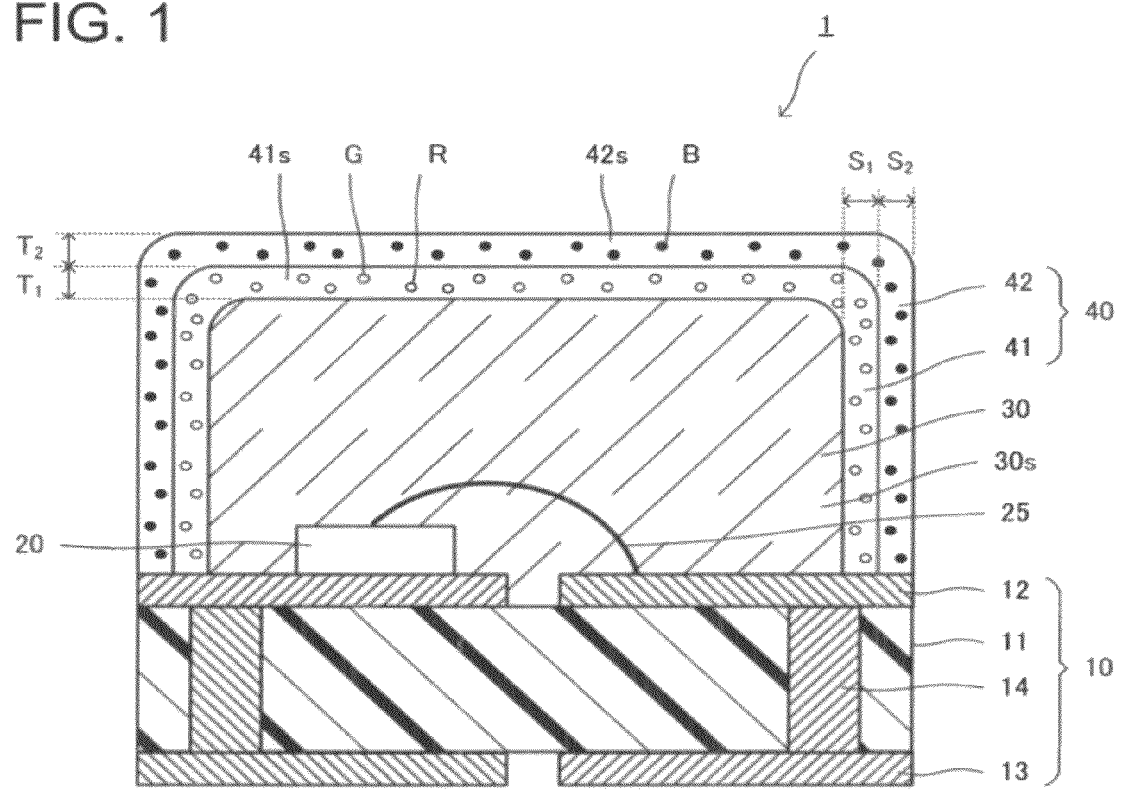
FIG. 1 is a cross-sectional view showing a white LED according to an embodiment.

Hereinafter, embodiments will be described. FIG. 1 is a cross-sectional view showing an example of a white LED. The white LED 1 includes a substrate 10 which has a front surface side electrode 12 as a conductive part provided on an insulation part 11, a light emitting element 20 mounted to the front surface side electrode 12 of the substrate 10, a transparent resin layer 30 sealing the light emitting element 20, and a phosphor layer 40 covering the transparent resin layer 30.

The substrate 10, concretely, has an insulation part 11, the front surface side electrode 12 and a rear surface side electrode 13 as conductive parts provided on front and rear surface sides of the insulation part 11, and a feeding via 14 penetrating the insulation part 11 to conduct the front surface side electrode 12 and the rear surface side electrode 13.

As the insulation part 11, there can be cited a plate material made of alumina, ceramics such aluminum nitride (AlN), or a glass epoxy resin, or the like. The insulation part 11 formed of an alumina plate or an aluminum nitride plate, which has a high thermal conductivity and suppresses temperature rise of the white LED 1, is preferable. Further, if the insulation part 11 is a glass epoxy resin plate provided with a heat releasing via made by filling a silver paste, a copper paste, or the like into a via hole penetrating an entire portion or part of the portion where the light emitting element 20 is provided of the front surface side electrode 12 and the rear surface side electrode 13, heat conductivity is high and temperature rise of the white LED 1 can be suppressed, and such an insulation part 11 is preferable.

The front surface side electrode 12 as the conductive part is disposed on the insulation part 11 and constitutes the substrate 10. Since the front surface side electrode 12 is the conductive part in a side where the light emitting element 20 is mounted, the front surface side electrode 12 is a light-reflecting electrode, for example. The light-reflecting electrode means an electrode having a reflectivity of 60% or more at a wavelength of 400 nm measured by a spectral reflectometer. As the light-reflecting electrode, there can be cited a metal electrode made of Ag, Pt, Ru, Pd, Al and the like.

When the front surface side electrode 12 is the light-reflecting electrode, even if part of second light from the phosphors (B, G, R) is reflected to a side of the front surface side electrode 12 or part of first light from the light emitting element 20 is reflected by an interface between the transparent resin layer 30 and the phosphor layer 40 thereby being reflected to the side of the front surface side electrode 12, the light can be reflected to an emerging surface side by the front surface side electrode 12, so that luminance of the white LED 1 can be heightened. On the other hand, since the rear surface side electrode 13 does not require light reflectivity unsimi-larly to the front surface side electrode 12, a well-known metal such as Ag, Pt, Ni, Cu, Au and the like can be used.

The light emitting element 20 emits ultraviolet light to violet light (first light) having a peak wavelength equal to or longer than 380 nm and equal to or shorter than 420 nm, preferably having a peak wavelength equal to or longer than 390 nm and equal to or shorter than 410 nm, and a light emitting diode of an InGaN system, a GaN system, or an AlGaN system, for example, is used. It should be noted that, instead of the light emitting diode, a laser which emits ultraviolet light to violet light having a peak wavelength equal to or longer than 380 nm and equal to or shorter than 420 nm, preferably having a peak wavelength equal to or longer than 390 nm and equal to or shorter than 410 nm, can be used as the light emitting element 20, and those light emitting diode and laser are collectively referred to as a light emitting element.

The light emitting element 20 is joined to one (in the diagram, of the left side) front surface side electrode 12 by various types of solder such as AuSn eutectic solder and the like for example, or a silver paste, and so on, and further, the electrode is electrically connected to the other (in the diagram, of the right side) front surface side electrode 12 by using a bonding wire 25.

The transparent resin layer 30 seals the light emitting element 20 and is constituted by a transparent resin cured product 30s. In general, a phosphor layer has a high reflective index and has a property of confining light inside thereof. Thus, if a phosphor layer is formed in a manner to directly cover the light emitting element, part of first light from the light emitting element is reflected by an interface with the phosphor layer to the light emitting element or visible light (second light) discharged from a phosphor of the phosphor layer is incident on the light emitting element, whereby such light is kept within the light emitting element and becomes difficult to be retrieved, leading to deterioration of an efficiency. Under the circumstances, the transparent resin layer 30 is provided in order to decrease an amount of the second light from the phosphor layer 40 to be incident on the light emitting element 20, thereby to suppress deterioration of the efficiency.

The transparent resin cured product 31 is made by curing a resin having high transparency. As the transparent resin, a silicone resin, an epoxy resin, and the like, for example, can be cited. Among the silicone resins, a dimethyl silicone resin, having high durability against an ultraviolet ray, is preferable. The transparent resin layer 30 can be formed, for example, by making a transparent resin flow down on the light emitting element 20 and the bonding wire 25, heating to equal to or higher than 100° C. and equal to or lower than 160° C. for example, and curing the transparent resin.

The phosphor layer 40 covers an upper surface and a side surface of the transparent resin layer 30, and has a first phosphor layer 41 disposed in a manner to cover the transparent resin layer 30 and a second phosphor layer 42 disposed in a manner to cover the outside of the first phosphor layer 4, that is, a side farther from the light emitting element 20. Further, with regard to the first phosphor layer 41 being a side nearer to the light emitting element 20, a green phosphor G and a red phosphor R are contained and a blue phosphor B is not contained in the transparent resin cured product 41s, for example, while with regard to the second phosphor layer 42 disposed in a position farther from the light emitting element 20, the blue phosphor B is contained and neither the green phosphor G nor the red phosphor R is contained in the transparent resin cured product 42s, for example.

It should be noted that, with regard to the white LED shown in FIG. 1, though only the green phosphor G and the red phosphor R are made to be contained as the phosphors in the first phosphor layer 41 and only the blue phosphor B is made to be contained as the phosphor in the second phosphor layer 42, the blue phosphor B can be contained in the first phosphor layer 41 and at least one of the green phosphor G and the red phosphor R can be contained in the second phosphor layer 42. However, if the blue phosphor B is made to be contained in the first phosphor layer 41, a content of the blue phosphor B is made to be equal to or less than 5 mass % of a total amount of the phosphors of the respective colors contained in the first phosphor layer 41. Further, if the phosphor other than the blue phosphor B is made to be contained in the second phosphor layer 42, a content of the phosphor other than the blue phosphor B is made to be equal to or less than 5 mass % of a total amount of the phosphors of the respective colors contained in the second phosphor layer 42.

By dividing the phosphor layer 40 into two layers, and sufficiently decreasing the content of the blue phosphor B in the first phosphor layer 41 being the side nearer to the light emitting element 20 compared with a conventional content and sufficiently increasing the content of the blue phosphor B in the second phosphor layer 42 being the side farther from the light emitting element 20 compared with a conventional content, chromaticity change of the white LED 1 can be suppressed effectively even if a temperature of the white LED 1 rises due to heat generation of the light emitting element 20 after light emission or an external environment.

Figure 2:
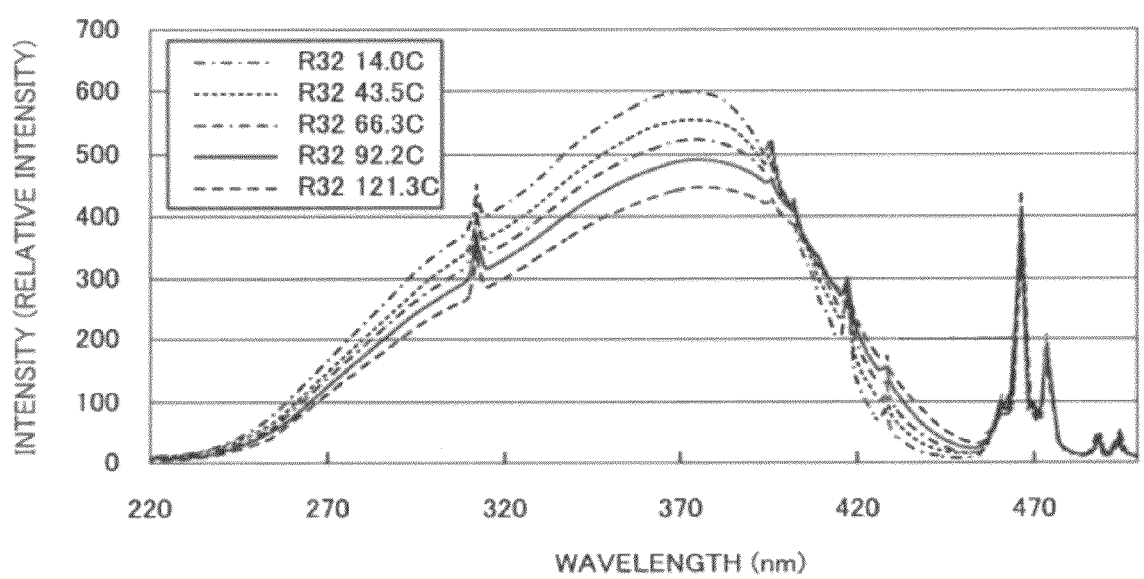
FIG. 2 is a graph showing an example of temperature change of an excitation spectrum of a red phosphor.

Here, FIG. 2 shows temperature change of an excitation spectrum of a red phosphor R (europium-activated lanthanum oxysulfide of a later-mentioned formula (4); $(La_{0.888}Eu_{0.11}M_{0.002})_2O_2S$, M is Sb). As shown in FIG. 2, upon temperature rise, an absorption amount near 430 nm to 460 nm where a general peak wavelength of blue light emitted from a blue phosphor B exists rises. If a blue phosphor B, a green phosphor G, and a red phosphor R are made mixedly contained in one phosphor layer as is conventionally done, a ratio at which the blue light emitted from the blue phosphor B is absorbed into the red phosphor R increases as the temperature rises, and as a consequence, the blue light becomes relatively decreased, whereby chromaticity changes. Concretely, the chromaticity changes in a manner that values x, y in an XYZ color system of CIE gradually increase as temperature rises.

It should be noted that though absorption of the blue light upon temperature rise is noticeably recognized particularly in a case that the red phosphor R is europium-activated lanthanum oxysulfide of a later-mentioned formula (4), similar absorption of the blue light is also recognized in red phosphors of other types, and also with regard to the green phosphor G, absorption of the blue light is recognized though not as much as in the case of the red phosphor R.

The phosphor layer 40 is divided into two layers, and the content of the blue phosphor B in the first phosphor layer 41 being the side nearer to the light emitting element 20 is decreased and the content of the blue phosphor B in the second phosphor layer 42 being the side farther from the light emitting element 20 is increased, whereby the blue light emitted from the blue phosphor B can emerge from the second phosphor layer 42 as it is, so that the amount absorbed into the green phosphor G or the red phosphor R can be decreased, and thereby an emerging amount of the blue light emitted from the blue phosphor B can be maintained even if temperature rises, and chromaticity change can be suppressed.

In view of suppressing absorption of the blue light emitted from the blue phosphor B into the green phosphor G or the red phosphor R as described above, it is preferable that the blue phosphor B is not contained in the first phosphor layer 41, but the first phosphor layer 41 may contain the blue phosphor B of equal to or less than 5 mass % in relation to a total amount of the phosphors of the respective colors contained in the first phosphor layer 41. If the content of the blue phosphor B contained in the first phosphor layer 41 exceeds 5 mass %, a difference from a conventional phosphor layer becomes small and an amount of the absorption of the blue light emitted from the blue phosphor B into the green phosphor G or the red phosphor R is increased, which is not preferable.

A content rate of the green phosphor G and the red phosphor R in the first phosphor layer 41 is adjusted so that desired chromaticity of white color can be obtained in a relationship with the second phosphor layer 42, and it is preferable that a ratio (content of green phosphor G/content of red phosphor R; mass ratio) of the content of the green phosphor G in relation to the content of the red phosphor R is equal to or larger than 0.05 and equal to or smaller than 0.4, for example. If the above-described mass ratio is smaller than 0.05 or larger than 0.4, there is a possibility that obtaining suitable chromaticity of white color as a backlight light source in a variety of liquid crystal display devices becomes difficult.

Further, with regard also to the second phosphor layer 42, from a similar view point, it is preferable that a phosphor other than the blue phosphor B, for example, the green phosphor G or the red phosphor R which absorb blue light, is not contained, but the second phosphor layer 42 may contain equal to or less than 5 mass % of phosphor other than the blue phosphor B in relation to a total amount of the phosphors of the respective colors contained in the second phosphor layer 42. If the content of the phosphor other than the blue phosphor B is equal to or less than 5 mass %, absorption of the blue light emitted from the blue phosphor B by the green phosphor G or the red phosphor R can be reduced and the blue light can be made emerge sufficiently, and as a consequence, chromaticity change can be efficiently suppressed even in a case that the temperature rises.

The transparent resin cured products 41s, 42s constituting the first phosphor layer 41 and the second phosphor layer 42 are made by curing a transparent resin with high transparency. As the transparent resin used for formation of the transparent resin cured products 41s, 42s, a transparent resin similar to the one used for formation of the transparent resin cured product 30s in the transparent resin layer 30 can be used.

The transparent resin cured product 30s constituting the transparent resin layer 30 and the transparent resin cured products 41s, 42s constituting the phosphor layer 40, that is, the first phosphor layer 41 and the second phosphor layer 42, can be resins of the same type or can be resins of different types. Further, the transparent resin cured product 41s constituting the first phosphor layer 41 and the transparent resin cured product 42s constituting the second phosphor layer 42 can also be resins of the same type or can also be resins of different types.

The blue phosphor B made to be contained in the phosphor layer 40, concretely, in the first phosphor layer 41 and the phosphor layer 42, receives first light of the light emitting element 20 and emits blue light, the green phosphor G receives the first light of the light emitting element 20 and emits green light, and the red phosphor R receives the first light of the light emitting element 20 and emits red light. As the blue phosphor B, the green phosphor G, and the red phosphor R, the following ones can be used, for example.

<Blue Phosphor B>

As the blue phosphor B, concretely, a blue phosphor emitting blue light with a peak wavelength of 430 nm to 460 nm is used. As the blue phosphor, a blue phosphor having a composition represented by formulas (1) or (2) shown below, for example, is used.

$$(Sr_{1-x-y-z}Ba_xCa_yEu_z)_{10}(PO_4)_6X_2 \qquad (1)$$

(In the formula, x, y, and z are values fulfilling $0 \leq x < 0.2$, $0 \leq y < 0.1$, $0.005 < z < 0.1$, and X is at least one element selected from F, Cl and Br.)

In the formula (1), x and y within ranges described above, with which a wavelength of light from the blue phosphor is suitable for a backlight purpose, are preferable. Further, as x and y each become larger in the above-described range, a light emitting component of a long wavelength of light from the blue phosphor increases. On the other hand, as x and y each become smaller within the above-described range, a spectrum width of the light from the blue phosphor is narrowed, becoming more suitable for the backlight purpose. Further, z within the above-described range, with which a light emission efficiency of the blue phosphor becomes higher, is preferable.

$$(Ba_{1-x-y-z}Sr_xCa_yEu_z)MgAl_{10}O_{17} \qquad (2)$$

(In the formula, x, y, and z are values fulfilling $0 \leq x < 0.5$, $0 \leq y < 0.1$, $0.15 < z < 0.4$.)

In the formula (2), x and y within ranges described above, with which a wavelength of light from the blue phosphor is suitable for a backlight purpose, are preferable. Further, as x and y each become larger in the above-described range, a light emitting component of a long wavelength of light from the blue phosphor slightly increases. Further, z within the above-described range, with which a light emission efficiency of the blue phosphor becomes higher, is preferable.

<Green Phosphor G>

As the green phosphor G, concretely, a green phosphor emitting green light with a peak wavelength of 490 nm to 575 nm is used. As the green phosphor, a green phosphor made of europium/manganese-activated aluminate having a composition represented by formula (3) shown below, for example, is used.

$$(Ba_{1-x-y-z}Sr_xCa_yEu_z)(Mg_{1-u}Mn_u)Al_{10}O_{17} \qquad (3)$$

(In the formula, x, y, z and u are values fulfilling $0 \leq x < 0.5$, $0 \leq y < 0.1$, $0.15 < z < 0.4$, $0.25 < u < 0.6$.)

In the formula (3), z and u within ranges described above, by which a light emission efficiency of the green phosphor is high, are preferable. Further, x and y within the above-described range, with which a balance between an operating life and a luminance of the green phosphor is good, are preferable. If x is equal to or larger than 0.5, there is a possibility that an operating life of a green phosphor is deteriorated.

<Red Phosphor R>

As the red phosphor R, concretely, a red phosphor emitting red light with a peak wavelength of 620 nm to 780 nm is used. As the red phosphor, europium-activated lanthanum oxysulfide having a composition represented by a formula (4) shown below, for example, is used.

$$(La_{1-x-y}Eu_xM_y)_2O_2S \qquad (4)$$

(In the formula, M is at least one element selected from Sb, Sm, Ga and Sn, and x and y are values fulfilling $0.08 \leq x < 0.17$, $0 \leq y < 0.003$.)

In the formula (4), M being at least one type of element chosen from Sb, Sm, Ga and Sn, with which a light emission efficiency of the red phosphor is high, is preferable. Further, x and y within above-described ranges, with which a wavelength of light from the red phosphor is suitable for a backlight purpose, are preferable.

The content of the phosphor in the first phosphor layer 41 is not necessarily limited, but is preferable to be equal to or more than 30 mass % and equal to or less than 80 mass % in a total amount of the transparent resin cured product 41s and the phosphor which constitute the first phosphor layer 41. It should be noted that the phosphor here means a total of the blue phosphor B, the green phosphor G, and the red phosphor R.

If the content of the phosphor in the first phosphor layer 41 is within such a range, a balance between light emitting efficiencies of the first phosphor layer 41 and the second phosphor layer 42 becomes appropriate and formation of the first phosphor layer 41 becomes easy. In other words, if the content of the phosphor in the first phosphor layer 41 is less than 30 mass %, first light penetrating the first phosphor layer 41 increases excessively, thereby deteriorating a light emission efficiency, and if the content of the phosphor in the first phosphor layer 41 exceeds 80 mass %, first light penetrating the first phosphor layer 41 decreases excessively, thereby deteriorating a light emission efficiency of the second phosphor layer 42, and formation of the first phosphor layer 41 is made difficult due to an excessively large content of the phosphor.

Further, the content of the phosphor in the second phosphor layer 42 is not necessarily limited either, but is preferable to be equal to or more than 30 mass % and equal to or less than 80 mass % in a total amount of the transparent resin cured product 42s and the phosphor which constitute the second phosphor layer 42. It should be noted that the phosphor here also means a total of the blue phosphor B, the green phosphor G, and the red phosphor R.

If the content of the phosphor in the second phosphor layer 42 is within such a range, a balance between light emission efficiencies of the first phosphor layer 41 and the second phosphor layer 42 becomes appropriate and formation of the second phosphor layer 42 becomes easy. In other words, if the content of the phosphor in the second phosphor layer 42 is less than 30 mass %, the light emission efficiency of the second phosphor layer 42 is lowered, and if the content of the phosphor in the first phosphor layer 41 exceeds 80 mass %, formation of the second phosphor layer 42 becomes difficult due to an excessively large content of the phosphor.

With regard to the first phosphor layer 41 and the second phosphor layer 42, when, in an upper surface side of the light emitting element 20, a thickness of the first phosphor layer 41 is represented by $T_1$ and a thickness of the second phosphor layer 42 is represented by $T_2$, it is preferable that $T_2/T_1$ is equal to or larger than 1 and equal to or smaller than 3. If $T_2/T_1$ is smaller than 1, the thickness $T_2$ of the second phosphor layer 42 is too thin in relation to the thickness $T_1$ of the first phosphor layer 41, whereby blue light emerging from the second phosphor layer 42 is relatively decreased, while if $T_2/T_1$ exceeds 3, the thickness $T_2$ of the second phosphor layer 42 is too thick in relation to the thickness $T_1$ of the first phosphor layer 41, whereby blue light emerging from the second phosphor layer 42 is relatively increased, and both cases, in which desired chromaticity of white color is difficult to be obtained, are not preferable.

Further, when, in a side surface side of the light emitting element 20, a thickness of the first phosphor layer 41 is represented by $S_1$ and a thickness of the second phosphor layer 42 is represented by $S_2$, it is preferable that $S_2/S_1$ is equal to or larger than 1 and equal to or smaller than 3. In other words, similarly to in the upper surface side of the light emitting element 20, if $S_2/S_1$ is less than 1, the thickness $S_2$ of the second phosphor layer is too thin in relation to the thickness $S_1$ of the first phosphor layer 41, whereby blue light emerging from the second phosphor layer 42 is relatively decreased, while if $S_2/S_1$ exceeds 3, the thickness $S_2$ of the second phosphor layer 42 is too thick in relation to the thickness $S_1$ of the first phosphor layer 41, whereby blue light emerging from the second phosphor layer 42 is relatively increased, and both cases, in which desired chromaticity of white color is difficult to be obtained, are not preferable.

It should be noted that, with regard to the thicknesses $T_1$ and $S_1$ of the first phosphor layer 41 and the thicknesses $T_2$ and $S_2$ of the second phosphor layer 42, it is preferable that, for example, $T_1$ is equal to or larger than 1000 μm and equal to or smaller than 3000 μm, $S_1$ is equal to or larger than 1000 μm and equal to or smaller than 3000 μm, $T_2$ is equal to or larger than 1000 μm and equal to or smaller than 9000 μm, and $S_2$ is equal to or larger than 1000 μm and equal to or smaller than 9000 μm, within a range fulfilling the above-described ratio of thicknesses. The thicknesses $T_1$, $S_1$ of the first phosphor layer 41 and the thicknesses $T_2$, $S_2$ of the second phosphor layer 42 deviating from such a range, which leads to an insufficient luminance of the white LED D1 and so on, are not preferable.

Next, a method for manufacturing a white LED 1 will be described. First, before formation of a phosphor layer 40, a light emitting element 20 is mounted to a substrate 10 on which a front surface side electrode 12 and a rear surface side electrode 13 are formed. Then, after an angular tube mold (mold for transparent resin layer formation) whose cross section is rectangular is provided and the angular tube mold is disposed in a manner to surround the light emitting element 20 and a bonding wire 25 on the substrate 10, a transparent resin is poured into the angular tube mold and cured by a heat processing, whereby a transparent resin layer 30 is formed. It should be noted that the angular tube mold is removed after the transparent resin layer 30 is formed.

Separately from the above, a green phosphor G and a red phosphor R are mixed with a transparent resin, and a blue phosphor B is mixed as necessary, thereby to prepare a first phosphor slurry. A content of the blue phosphor B in an entire phosphor in the first phosphor slurry is equal to or less than 5 mass % and it is preferable that the blue phosphor B is not contained at all, and a content of the entire phosphor in the first phosphor slurry, that is, a content of the entire phosphor in a total amount of the transparent resin and the entire phosphor is equal to or more than 30 mass % and equal to or less than 80 mass %.

The first phosphor slurry as above can be prepared, for example, by mixing a green phosphor G and a red phosphor R, and a blue phosphor B as necessary, with a transparent resin individually thereby to prepare phosphor slurries of respective colors and thereafter further mixing such a plurality of phosphor slurries, or can be prepared, for example, by mixing a green phosphor G and a red phosphor R, and a blue phosphor B as necessary in advance thereby to make a phosphor mixture and thereafter mixing the phosphor mixture with a transparent resin.

Further, an angular tube mold (mold for first phosphor layer formation) whose cross section is rectangular is provided and the angular tube mold is disposed in a manner to surround the previously formed transparent resin layer 30 on the substrate 10 and thereafter the first phosphor slurry is poured into the angular tube mold and cured by a heat processing, whereby a first phosphor layer 41 is formed. It should be noted that this angular tube mold is also removed after the first phosphor layer 41 is formed.

Further, separately from the above, a blue phosphor B is mixed with a transparent resin, and a green phosphor G or a red phosphor R is mixed as necessary, thereby to prepare a second phosphor slurry. A content of the phosphor other than the blue phosphor B in an entire phosphor in the second phosphor slurry is equal to or less than 5 mass % and it is preferable that the phosphor other than the blue phosphor B is not contained at all, and a content of the entire phosphor in the second phosphor slurry, that is, a content of the entire phosphor in a total amount of the transparent resin and the entire phosphor is equal to or more than 30 mass % and equal to or less than 80 mass %.

The second phosphor slurry as above can be prepared, for example, by mixing a blue phosphor B with a transparent resin. Further, when making a green phosphor G or a red phosphor R contained together with the blue phosphor B in the second phosphor slurry, the second phosphor slurry can be prepared, for example, by mixing the blue phosphor B, the green phosphor G, and the red phosphor R with a transparent resin individually, thereby to prepare phosphor slurries of the phosphors of respective colors and thereafter further mixing such a plurality of phosphor slurries, or can be prepared, for example, by mixing the blue phosphor B, the green phosphor G, and the red phosphor R in advance thereby to make a phosphor mixture and thereafter mixing the phosphor mixture with a transparent resin.

Then, an angular tube mold (mold for second phosphor layer formation) whose cross section is rectangular is provided and the angular tube mold is disposed in a manner to surround the previously formed first phosphor layer 41 on the substrate 10, and thereafter the second phosphor slurry is poured into the angular tube mold and cured by a heat processing, whereby a second phosphor layer 42 is formed, the angular tube mold being removed, and a white LED 1 is obtained.

According to the above-described method for manufacturing, it is possible to form a first phosphor layer 41 in which a content of a blue phosphor B in an entire phosphor is equal to or less than 5 mass %, preferably in which no blue phosphor B is contained, in a side nearer to a light emitting element 20, and to form a second phosphor layer 42 in which a content of a phosphor other than the blue phosphor B in the entire phosphor is equal to or less than 5 mass %, preferably in which no phosphor other than the blue phosphor B is contained, in a side farther from the light emitting element 20, whereby a white LED 1 suppressing chromaticity change due to temperature rise can be manufactured.

Figure 3:
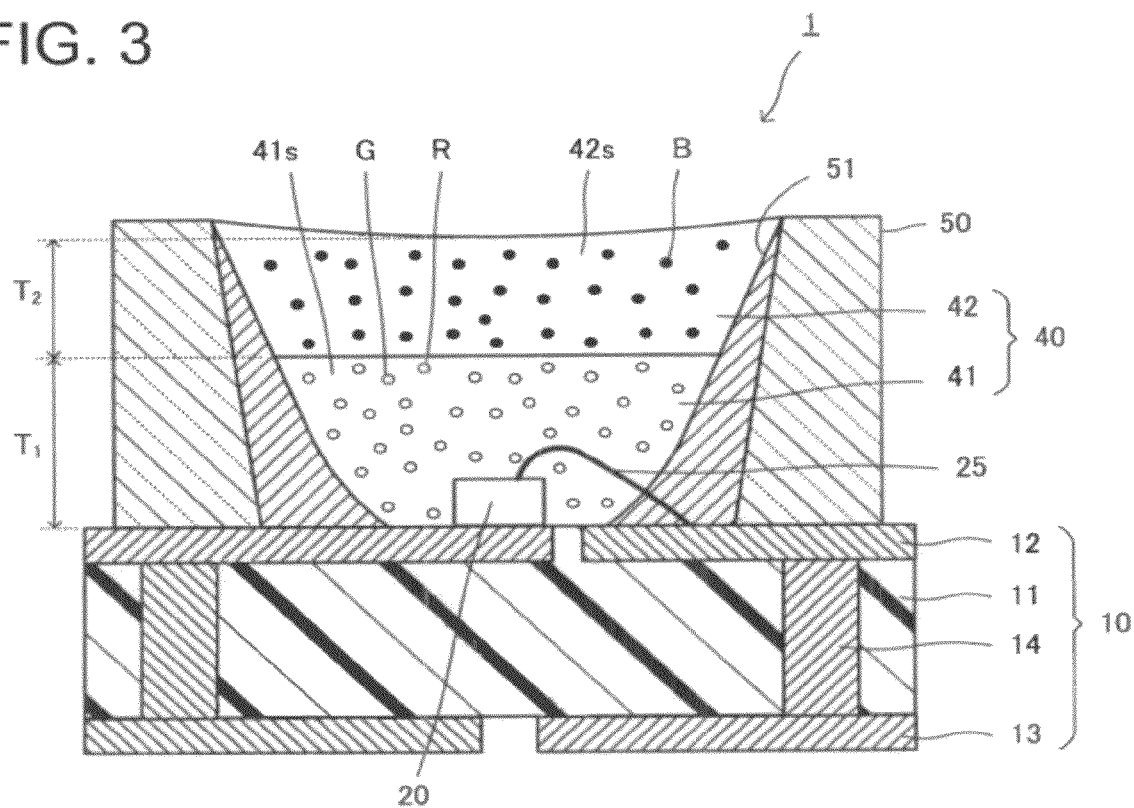
FIG. 3 is a cross-sectional view showing a white LED according to another embodiment.

FIG. 3 is a cross-sectional view showing another embodiment of a white LED 1. As shown in FIG. 3, the white LED 1 may include a cylindrical frame part 50 constituted by a resin or the like, in which a light emitting element 20 may be disposed and a first phosphor layer 41 and a second phosphor layer 42 as a phosphor layer 40 may be disposed in a manner to cover the light emitting element 20. Further, on an inner surface of the frame part 50, for example, a light emitting element 20 or a reflection layer 51 reflecting emission from phosphors (B, G, R) may be formed.

With regard also to the white LED 1 as above, basic constitutions of the light emitting element 20 and the phosphor layer 40 (first phosphor layer 41, second phosphor layer 42) can be the same as the constitutions in the white LED 1 shown in FIG. 1, and by using such constitutions, a similar effect, that is, an effect of suppressing chromaticity change due to temperature rise can be obtained.

It should be noted that in the white LED 1 shown in FIG. 3 a thickness $T_1$ of the first phosphor layer 41 is a length from a surface of a substrate 10 on which the light emitting element 20 is mounted to a boundary surface between the first phosphor layer 41 and the second phosphor layer 42, and a thickness $T_2$ of the second phosphor layer 42 is a length from the boundary surface between the first phosphor layer 41 and the second phosphor layer 42 to a surface of the second phosphor layer 42. It should be noted that if the surface of the second phosphor layer is recessed, a length to the most recessed portion is regarded as the length. Further, with regard to the thickness $T_1$ of the first phosphor layer 41 and the thickness $T_2$ of the second phosphor layer 42 as above, it is preferable that, for example, $T_1$ is equal to or larger than 300 µm and equal to or smaller than 700 µm and that $T_2$ is equal to or larger than 300 µm and equal to or smaller than 2100 µm, within a range fulfilling the predetermined ratio of thicknesses having been already explained.

A plurality of the white LED 1 can be disposed linearly or surfacely and used as a light source of a backlight. Further, such backlights can be suitably used as light sources of a variety of liquid crystal display devices such as small screens of a cellular phone, a car navigation system, and a mobile communication device, and medium/large screens of a personal computer or TV and so on.

Figure 4:
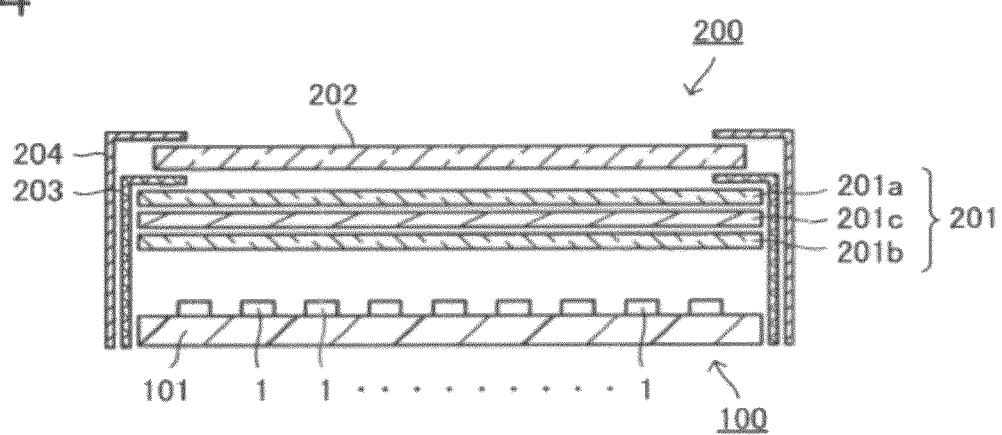
FIG. 4 is a schematic cross-sectional view showing a backlight and a liquid crystal display device according to an embodiment.

FIG. 4 is a cross-sectional view schematically showing a backlight 100 using a white LED 1 and a liquid crystal display device 200 using the backlight 100. The backlight 100 is a direct-type backlight and is constituted, for example, by a substrate 101 and a plurality of white LEDs 1 arranged in a plane direction on the substrate 101. Further, the liquid crystal display device 200 has, for example, an optical sheet part 201 provided in a manner to cover a light emitting surface side of such a backlight 100 and a liquid crystal panel 202 provided in a manner to cover an outer side of the optical sheet part 201.

The optical sheet part 201 is constituted, for example, by a pair of diffusion sheets 201a, 201b and a prism sheet 201c sandwiched by the pair of diffusion sheets 201a, 201b, and is fixed to the backlight 100 by means of an inner frame part 203 constituted by a resin, a metal or the like.

Further, the liquid crystal panel 202 is formed in a manner that an array substrate and a color filter substrate each having a transparent electrode formed thereon and being a glass plate are disposed in a manner to face to each other between, for example, two polarizing plates and liquid crystal is injected between the array substrate and the color filter substrate, thereby constituting a liquid crystal layer, and blue (B), green (G), and red (R) color filters corresponding to each pixel are formed on the color filter substrate. Such a liquid crystal panel 202 is fixed to the backlight 100 in a manner to cover the optical sheet part 201 by means of an external frame part 204 constituted by a resin or a metal.

Hereinabove, the backlight and the liquid crystal display device are described, but the backlight is not limited in a form as long as the backlight is one to which the white LED is applied, and can be the direct-type backlight as shown in FIG. 4 or can be a sidelight-type backlight, which is not shown. Further, the liquid crystal display device is not limited in a form as long as the backlight is applied thereto, and can be one to which the direct-type backlight as shown in FIG. 4 is applied or can be one to which a sidelight-type backlight is applied, which is not shown.

EXAMPLE 1

An ultraviolet-light light emitting diode with a light emission peak wavelength of 400 nm as a light emitting element is mounted on a substrate and a mold for transparent resin layer formation is disposed in a manner to surround the ultraviolet-light light emitting diode, and a silicone resin is poured into the mold for transparent resin layer formation and cured by being left for thirty minute at a temperature of 150° C., whereby a transparent resin layer is formed.

Separately from the above, a green phosphor and a red phosphor are mixed with a silicone resin, thereby to prepare a first phosphor slurry. With regard to the first phosphor slurry, a mass ratio of the green phosphor and the red phosphor is made to be 16:84, and a total content of the green phosphor and the red phosphor in the first phosphor slurry is made to be 60 mass %. Then, a mold for first phosphor layer formation is disposed in a manner to surround the previously formed transparent resin layer, the first phosphor slurry is poured into the mold for first phosphor layer formation and cured by being left for thirty minutes at a temperature of 150° C., whereby a first phosphor layer is formed.

Further, separately from the above, a second phosphor slurry is prepared by mixing a blue phosphor with a silicone resin. With regard to the second phosphor slurry, a content of the blue phosphor is made to be 50 mass %. Then, a mold for second phosphor layer formation is disposed in a manner to surround the previously formed first phosphor layer, and the second phosphor slurry is poured into the mold for second phosphor layer formation and cured by being left for thirty minutes at a temperature of 150° C., whereby a second phosphor layer is formed, and a white LED as shown in FIG. 1 is manufactured.

It should be noted that as the blue phosphor, the green phosphor, and the red phosphor, the following phosphors are used.

<Blue Phosphor>
$(Sr_{0.9}Ba_{0.04}Ca_{0.01}Eu_{0.05})_{10}(PO_4)_6.Cl$ (average particle size: 16 µm)

<Green Phosphor>
$(Ba_{0.7}Sr_{0.015}Ca_{0.005}Eu_{0.28})(Mg_{0.65}Mn_{0.36})Al_{10}O_{17}$ (average particle size: 18 µm)

<Red Phosphor>
$(La_{0.898}Eu_{0.1}M_{0.002})_2O_2S$ (M is Sm, average particle size: 22 µm)

Further, a thickness $T_1$ of the first phosphor layer in an upper surface side of the light emitting element is 2000 µm, a thickness $T_2$ of the second phosphor layer is 4000 µm, and $T_2/T_1$ is 2, while a thickness $S_1$ of the first phosphor layer in a side surface side of the light emitting element is 2000 µm, a thickness $S_2$ of the second phosphor layer is 4000 µm, and $S_2/S_1$ is 2.

COMPARATIVE EXAMPLE 1

An ultraviolet-light light emitting diode with a light emission peak wavelength of 400 nm as a light emitting element is mounted on a substrate and a mold for transparent resin layer formation is disposed in a manner to surround the ultraviolet-light light emitting diode, and a silicone resin is poured into the mold for transparent resin layer formation and cured by being left for thirty minute at a temperature of 150° C., whereby a transparent resin layer is formed.

Separately from the above, a blue phosphor, a green phosphor, and a red phosphor which are similar to the ones used in the working example 1 are mixed with a silicone resin, thereby to prepare a three-color phosphor slurry. With regard to the three-color phosphor slurry, a mass ratio of the blue phosphor, the green phosphor, and the red phosphor is made to be 23:11:66, and a total content of the phosphors of three colors in the three-color phosphor slurry is made to be 70 mass %. Then, a mold for phosphor layer formation is disposed in a manner to surround the previously formed transparent resin layer, the three-color phosphor slurry is poured into the mold for phosphor layer formation and cured by being left for thirty minutes at a temperature of 150° C., whereby a three-color phosphor layer is formed, and a white LED is manufactured.

Figure 5:
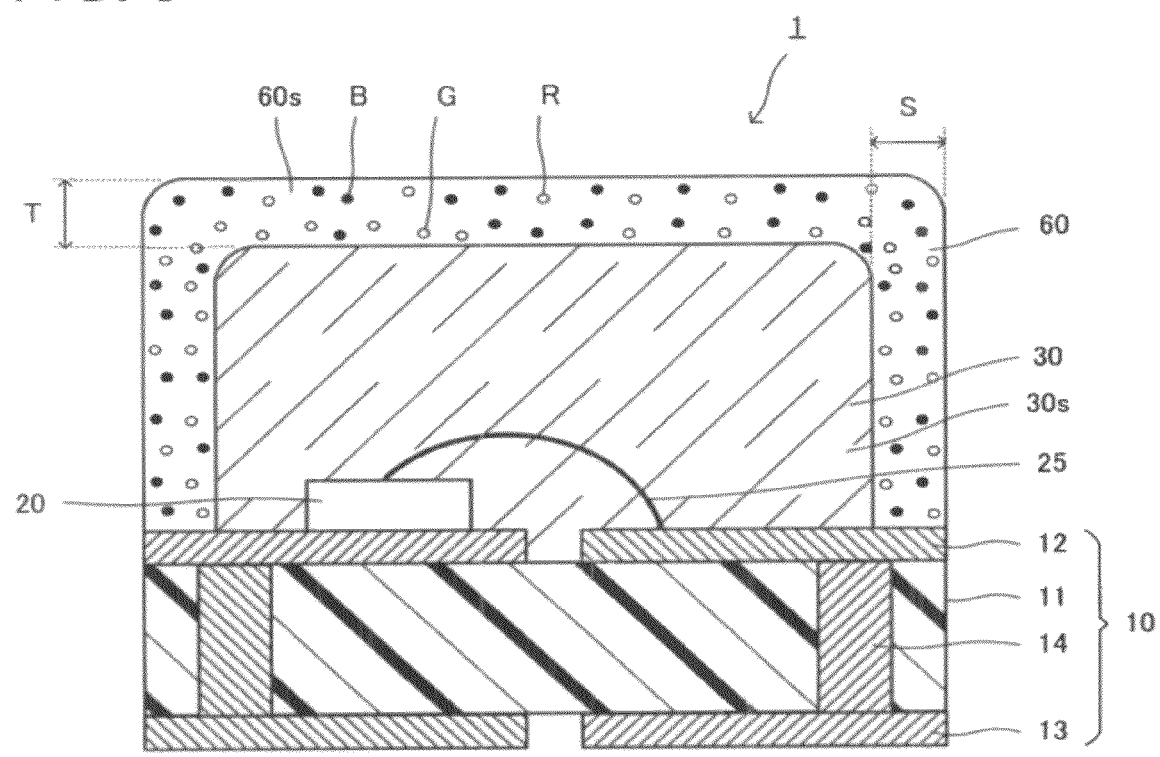
FIG. 5 is a cross-sectional view showing a white LED according to a comparative example.

A cross-sectional view of the white LED manufactured as above is shown in FIG. 5. As shown in FIG. 5, in the white LED 1 a three-color phosphor layer 60 is formed in a manner to cover a transparent resin layer 30, and the three-color phosphor layer 60 mixedly contains a blue phosphor B, a green phosphor G, and a red phosphor R in a transparent resin cured product 60s. Further, in the white LED 1, a thickness T of the three-color phosphor layer 60 in a front surface side of a light emitting element 20 is 6000 μm while a thickness S of the three-color phosphor layer 60 in a side surface side is 6000 μm.

Next, for white LEDs of the working example 1 and the comparative example 1 which have been manufactured as above, an instantaneous multiple photometry system MCPD-3700 of Otsuka Electronics Co., Ltd. is used, and chromaticity is measured at a current of 20 mA in a room temperature (25° C.). As a result, in the white LED of the working example 1, x in an XYZ color system of CIE is 0.297 and y is 0.262. Further, in the white LED of the comparative example 1, x in a similar XYZ color system of CIE is 0.298 and y is 0.257. It should be noted that hereinafter in an XYZ color system of CIE at 25° C. x is indicated as $x_{25}$, and y is indicated as $y_{25}$.

Thereafter, in a state that the white LEDs of the working example 1 and the comparative example 1 are heated to 100° C., chromaticity is measured in a like manner. In the XYZ color system of CIE at 100° C., x is indicated as $x_{100}$, y is indicated as $y_{100}$. Then, as indices for evaluating deviation (change) in chromaticity at a time when temperatures of the white LEDs of the working example 1 and the comparative example 1 are risen from the room temperature to 100° C., there are obtained Δx, Δy being differences between $x_{100}$ or $y_{100}$ in the XYZ color system of CIE at 100° C. and $x_{25}$ or $y_{25}$ in the XYZ color system of CIE at the room temperature. It should be noted that Δx, Δy are represented by the following formulas. Results will be shown in Table 1.

$$\Delta x = x_{100} - x_{25}$$

$$\Delta y = y_{100} - x_{25}$$

TABLE 1

| | Δx | Δy |
|---|---|---|
| EXAMPLE 1 | 0.012 | 0.004 |
| COMPARATIVE EXAMPLE 1 | 0.040 | 0.031 |

As is obvious from Table 1, in the white LED of the working example 1 in which the phosphor layer is divided into two layers, the first phosphor layer in which the green phosphor and the red phosphor are contained and the blue phosphor is not contained is disposed in a side nearer to the light emitting element and the second phosphor layer in which the blue phosphor is made to be contained and neither the green phosphor nor red phosphor is made to be contained is disposed in a side farther from the light emitting element, increase of Δx, Δy upon temperature rise is suppressed compared with the white LED of the comparative example 1 in which the blue phosphor, the green phosphor, and the red phosphor are made to be contained in the same phosphor layer, and it is found that deviation in chromaticity is effectively suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A white LED, comprising:
   a light emitting element with a light emission peak wavelength in a range of 380 to 420 nm; and
   a phosphor layer containing three or more types of phosphors including at least a blue phosphor, a green phosphor, and a red phosphor,
   wherein the phosphor layer has a first phosphor layer containing a mixture of the green phosphor and the red phosphor, and a second phosphor layer containing the blue phosphor and disposed on an opposite side of a side of the light emitting element of the first phosphor layer;
   wherein a content of the blue phosphor in an entire phosphor contained in the first phosphor layer is 5 mass % or less, or the blue phosphor is not contained in the first phosphor layer,
   wherein a content of phosphor other than the blue phosphor in an entire phosphor contained in the second phosphor layer is 5 mass % or less, or no phosphor other than the blue phosphor is contained in the second phosphor layer,
   wherein a ratio of a content of the green phosphor to a content of the red phosphor in the first phosphor layer is in a range of 0.05 to 0.4, and
   wherein a ratio of a thickness of the second phosphor layer to a thickness of the first phosphor layer is in a range of 1 to 3.

2. The white LED as set forth in claim 1,
   wherein the first phosphor layer does not contain the blue phosphor, and the second phosphor layer does not contain the green phosphor or the red phosphor.

3. The white LED as set forth in claim 1,
   wherein the blue phosphor comprises at least one selected from an europium-activated halophosphate phosphor with a composition represented by a general formula (1):

$$(Sr_{1-x-y-z}Ba_xCa_yEu_z)_{10}(PO_4)_6 \cdot X_2 \quad (1)$$

where, X is at least one element selected from F, Cl and Br, x is a value satisfying $0 \leq x < 0.2$, y is a value satisfying $0 \leq y < 0.1$, and z is a value satisfying $0.005 < z < 0.1$, and an europium-activated aluminate phosphor with a composition represented by a general formula (2):

$$(Ba_{1-x-y-z}Sr_xCa_yEu_z)MgAl_{10}O_{17} \quad (2)$$

where, x is a value satisfying $0 \leq x < 0.5$, y is a value satisfying $0 \leq y < 0.1$, and z is a value satisfying $0.15 < z < 0.4$, wherein the green phosphor comprises an europium/manganese-activated aluminate phosphor with a composition represented by a general formula (3):

$$(Ba_{1-x-y-z}Sr_xCa_yEu_z)(Mg_{1-u}Mn_u)Al_{10}O_{17} \quad (3)$$

where, x is a value satisfying $0 \leq x < 0.5$, y is a value satisfying $0 \leq y < 0.1$, z is a value satisfying $0.15 < z < 0.4$, and u is a value satisfying $0.25 < u < 0.6$, and wherein the red phosphor comprises an europium-activated lanthanum oxysulfide phosphor with a composition represented by a general formula (4):

$$(La_{1-x-y}Eu_xM_y)_2O_2S \quad (4)$$

where, M is at least one element selected from Sb, Sm, Ga and Sn, x is a value satisfying $0.08<x<0.17$, and y is a value satisfying $0 \leq y<0.003$.

4. The white LED as set forth in claim 1,
wherein the light emission peak wavelength of the light emitting element is in a range of 390 to 410 nm.

5. A backlight, comprising:
a plurality of the white LEDs as set forth in claim 1; and
a substrate to which the plurality of white LEDs are mounted.

6. A liquid crystal display device, comprising:
a backlight comprising a plurality of the white LEDs as set forth in claim 1, and a substrate to which the white LEDs are mounted; and
a liquid crystal panel disposed in a light emitting surface side of the backlight.

7. The white LED as set forth in claim 1,
wherein the first phosphor layer comprises a first transparent resin layer and the phosphor dispersed in the first transparent resin layer, and a content of the phosphor contained in the first phosphor layer is in a range of 30 to 80 mass %, and
wherein the second phosphor layer comprises a second transparent resin layer and the phosphor dispersed in the second transparent resin layer, and a content of the phosphor contained in the second phosphor layer is in a range of 30 to 80 mass %.

8. The white LED as set forth in claim 7, further comprising:
a third transparent resin layer not containing a phosphor and sealing the light emitting element,
wherein the first transparent resin layer of the first phosphor layer is formed on an outer surface of the third transparent resin layer, and the second transparent resin layer of the second phosphor layer is formed on an outer surface of the first transparent resin layer.

9. The white LED as set forth in claim 1,
wherein a thickness of the first phosphor layer is in a range of 1000 to 3000 μm, and
wherein a thickness of the second phosphor layer is in a range of 1000 to 9000 μm.

* * * * *